United States Patent [19]
Baur et al.

[11] 4,016,590
[45] Apr. 5, 1977

[54] ELECTROMAGNETIC RADIATION DETECTOR

[75] Inventors: Robert F. Baur, Lynn; David M. Comey, Concord; Gene A. Robillard, Stoneham, all of Mass.

[73] Assignee: Honeywell Inc., Minneapolis, Minn.

[22] Filed: Nov. 7, 1975

[21] Appl. No.: 629,836

[52] U.S. Cl. .................. 357/30; 357/31; 357/55; 357/29; 250/211 J
[51] Int. Cl.² ..................................... H01L 27/14
[58] Field of Search ............... 357/30, 31, 55, 29; 250/211 J

[56] References Cited
UNITED STATES PATENTS

| | | | |
|---|---|---|---|
| 3,293,435 | 12/1966 | Huth | 250/83.3 |
| 3,707,657 | 12/1972 | Veith | 317/235 R |

*Primary Examiner*—Martin H. Edlow
*Attorney, Agent, or Firm*—David R. Fairbairn

[57] ABSTRACT

An electromagnetic radiation detector has a first surface which receives incident electromagnetic radiation. The sides of the detector are sloped such that incident radiation does not initially strike the sides.

7 Claims, 10 Drawing Figures

ELECTROMAGNETIC RADIATION DETECTOR

BACKGROUND OF THE INVENTION

The present invention is related to electromagnetic radiation detectors and methods of making the same. In particular, the present invention is directed to detectors exhibiting improved performance when used in scanning or imaging systems.

In recent years, scanning or imaging systems using photodetectors have attained considerable importance. Systems operating both in the visible and infrared portions of the electromagnetic specturm have been developed.

In infrared imaging systems, for example, an infrared detector or an array of detectors is optically scanned to expose the detector or detectors to a field of view. The electrical signals derived from the detector or detectors are processed to generate an image of the scene observed by the detectors.

SUMMARY OF THE INVENTION

It has been observed that thick film (> 1μm) detectors utilized in scanning or imaging systems typically have sides which slope slightly outward from the front surface of the detector to the back surface of the detector. This slight outward slope is generally the result of processing steps, such as etching, which are used to prepare the front surface. As a result, the sides as well as the front surface can receive incident radiation.

When an image is scanned across a photodetector having outwardly sloping sides, the image first encounters one of the sides, then traverses the front surface of the detector, and then passes the second sloping side. This adversely affects the resolution of the detector when it is used in a scanning or imaging system.

The photodetector of the present invention overcomes this problem and provides improved scanning resolution. The detector comprises a body of detector material having first and second surfaces. The first or front surface is adapted to receive incident electromagnetic radiation. At least one side of the body extends from the first surface to the second surface such that the incident radiation directed essentially normal to the first surface initially strikes the first surface rather than the side. This can be achieved by a side which slopes generally inwardly from the first surface to the second surface.

DETAILED DESCRIPTION OF THE PREFERRED EMBODIMENTS

Figure 1A:
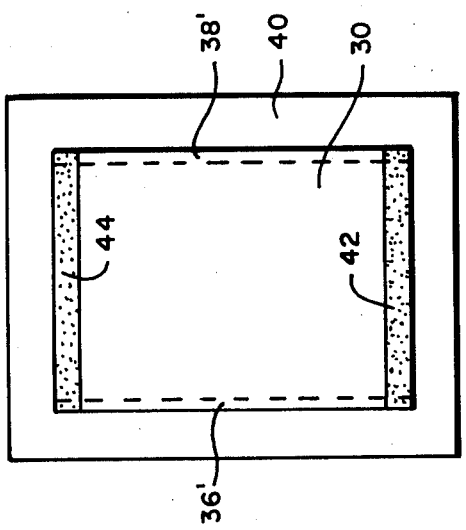
FIGS. 1A and 1B show top and side views of a prior art detector.
Figure 1B:
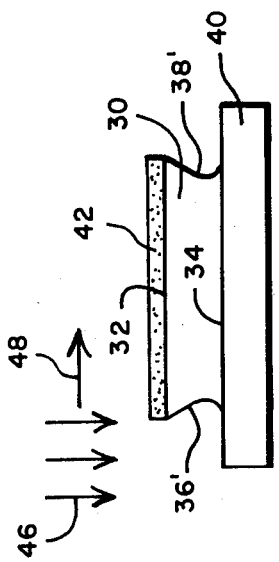

FIGS. 1A and 1B show a prior art detector used in scanning or imaging systems. A body 10 of detector material has front and back surfaces 12 and 14 and side surfaces 16 and 18. Back surface 14 is attached to a substrate 20. Electrical contacts 22 and 24 derive an electrical output signal from body 10.

When incident radiation 26 is scanned across the detector in the direction indicated by arrow 28, the incident radiation 26 first impinges upon side 16. Radiation 26 then impinges upon front surface 12 and finally upon side 18.

It has been discovered that outwardly sloping sides like those shown as sides 16 and 18 adversely affect resolution because the angle of radiation striking the sloping sides is non-uniform. It has also been found that conventional processing techniques for forming photodetectors tend to result in at least some outward slope of the sides.

FIGS. 2A and 2B and FIGS. 3A and 3B show two embodiments of the detector of the present invention. Since these embodiments are generally similar, similar numerals are used to designate similar elements.

Figure 2A:
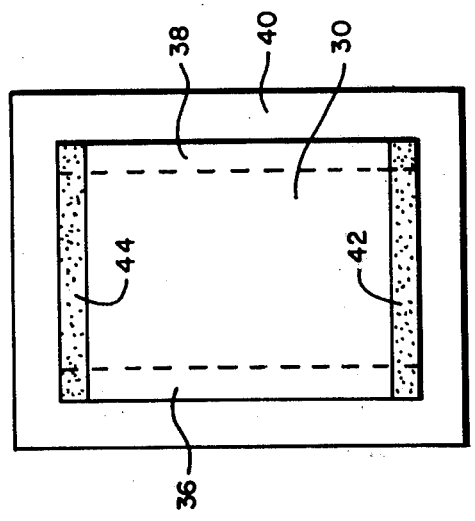
FIGS. 2A and 2B show top and side views of one embodiment of the detector of the present invention.
Figure 2B:
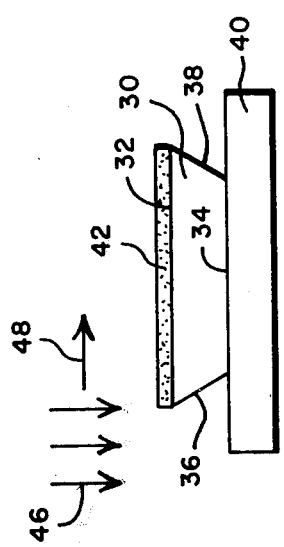

The detector of FIGS. 2A and 2B comprises a body of detector material 30 having first and second surfaces 32 and 34, and first and second sides 36 and 38. The detector is mounted on a substrate 40. Electrical contacts 42 and 44 derive an electrical output signal from the detector.

As can be seen from FIGS. 2A and 2B, first surface 32 has a surface area which is greater than the surface area of second surface 34. As a result, sides 36 and 38 slope generally inwardly from first surface 32 to second surface 34.

The detector of FIGS. 2A and 2B overcomes the resolution problem experienced with prior art detectors. The sides 36 and 38 do not initially receive incident radiation 46 which is directed essentially normal to first surface 32. When incident radiation 46 is scanned across the detector in the direction indicated by arrow 48, it only impinges upon first surface 32. This results in improved resolution as the scanned radiation reaches and leaves the detector.

Figure 3A:
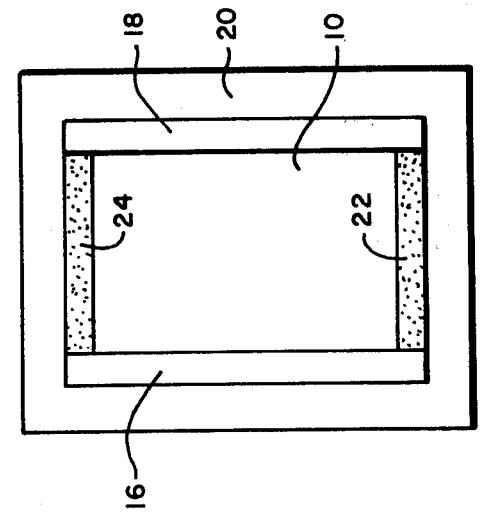
FIGS. 3A and 3B show top and side views of another embodiment of the detector of the present invention.
Figure 3B:
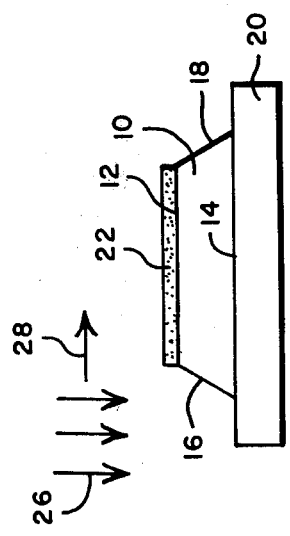

It can be seen that the improved resolution is achieved so long as the sides have projections in a plane defined by first surface 32 which are entirely within the outer boundaries of first surface 32. The particular shape of the sides is not critical, so long as they slope generally inwardly from first surface 32 to second surface 34. FIGS. 3A and 3B show an embodiment in which sides 36' and 38' do not have a uniform slope.

Figure 4A:
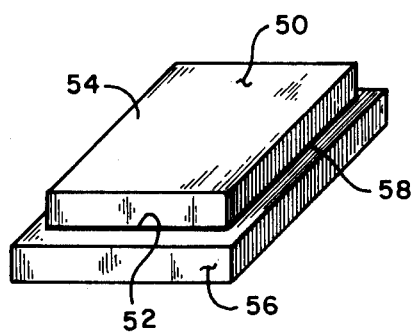
FIGS. 4A through 4D show a preferred process of forming the detector of the present invention.

FIGS. 4A through 4D show a highly advantageous method of forming the improved detector of the present invention. In FIG. 4A, a body 50 of detector material has first and second surfaces 52 and 54. A temporary substrate 56 is attached to first surface 52 by an adhesive layer 58. In one preferred embodiment, body 50 is a semiconductor material-mercury cadmium telluride, the temporary substrate is IRTRAN 2, and the adhesive layer is Scotchcast 504 epoxy.

Figure 4B:
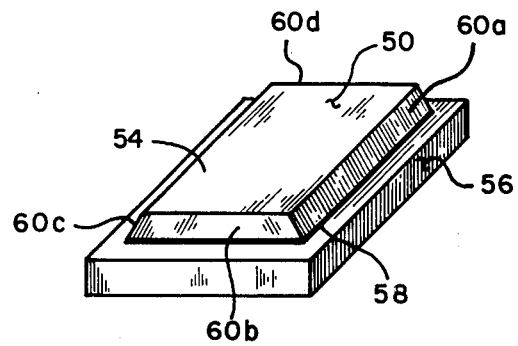

In FIG. 4B, sides 60a through 60d of body 50 are beveled. As a result of the beveling, second surface 54 has a surface area which is less than the surface area of first surface 52, and the sides 60a through 60d slope inwardly from first surface 52 to second surface 54. In the preferred embodiment, the beveling of sides 60a through 60d is achieved by an abrasion technique such as air abrasion. The (Hg,Cd)Te body 50 is then etched with a solution such a bromine-methanol. The etch smooths beveled sides 60a through 60d and reduces the thickness of body 50 to a predetermined thickness.

Figure 4C:
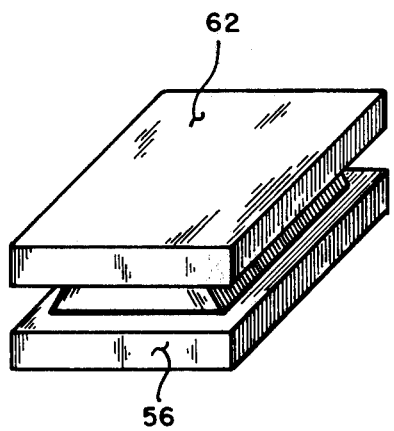

In FIG. 4C, permanent substrate 62 is attached to second surface 54. In the preferred embodiment in which body 50 is (Hg,Cd)Te, permanent substrate 62 is preferably IRTRAN 2. The (Hg,Cd)Te body 50 and permanent substrate 62 are bonded to one another by an adhesive such as Sctochcast 504 epoxy.

Figure 4D:
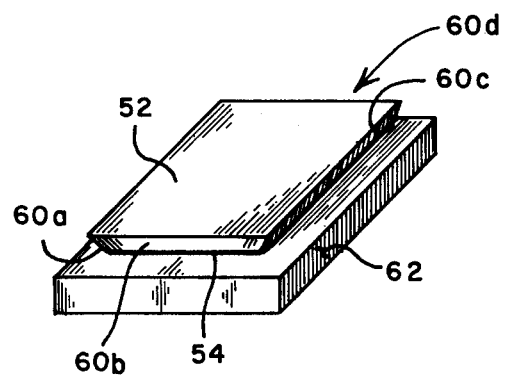

In FIG. 4D, temporary substrate 56 is removed to expose first surface 52. Removal of temporary substrate 56 may be, for example, by lapping the temporary substrate 56 and adhesive layer 58 until first surface 52 is exposed. The resulting device shown in FIG. 4D has a first surface 52, a second surface 54, and sides 60a through 60d which slope generally inwardly from first surface 52 to second surface 54.

After the steps shown in FIG. 4D have been completed, the rmaining processing of the detector is done. For example, electrodes are attached to the detector and an anti-reflection coating may be provided on surface 52. These processing techniques are well known in the art and do not require further discussion.

In conclusion, the detector of the present invention overcomes the scanning or imaging resolution problems of prior art detectors. In addition, the process shown in FIGS. 4A through 4D describes an advantageous and simple method of forming the detector of the present invention.

Although the present invention has been described with reference to preferred embodiments, workers skilled in the art will recognize that changes may be made in form and details without departing from the spirit and scope of the present invention. For example, although (Hg,Cd)Te has been specifically discussed as a preferred detector material, other detector materials such as lead tin telluride, indium antimonide, germanium, silicon, and gallium phosphide may also be utilized. The detector may be a photoconductive detector, a photodiode or any other solid state electromagnetic radiation detector. In addition, the number of sides which must be sloped generally inwardly depends, of course, on the particular application of the detector in the scanning system and upon the shape of the detector. Depending upon scanning or imaging system requirements, as few as one or as many as four sides of a square or rectangular detector may require the generally inward slope of the present invention.

The embodiments of the invention in which an exclusive property or right is claimed are defined as follows:

1. An electromagnetic radiation detector comprising:
   a body of detector material;
   first and second opposing surfaces of the body, the first surface being adapted to receive eletromagnetic radiation; and
   a first side sloping generally inwardly from the first surface to the second surface.

2. The electromagnetic radiation detector of claim 1 and further comprising a second side sloping generally inwardly from the first surface to the second surface.

3. The electromagnetic radiation detector of claim 2 and further comprising third and fourth sides sloping generally inwardly from the first surface to the second surface.

4. The electromagnetic radiation detector of claim 1 wherein the detector material is a semiconductor material.

5. The electromagnetic radiation detector of claim 4 wherein the semiconductor material is mercury cadmium telluride.

6. An electromagnetic radiation detector comprising:
   A body of detector material;
   a first surface adapted to receive incident radiation;
   a second surface opposite the first surface; and
   first and second sides extending from the first surface to the second surface such that incident radiation directed essentially normal to the first surface does not strike the first and second sides.

7. An electromagnetic radiation detector comprising:
   a body of detector material;
   a first surface of the body adapted to receive incident radiation;
   a second surface of the body opposite the first surface; and
   first and second sides of the body extending from the first surface to the second surface such that the first and second sides have projections in a plane defined by the first surface which are within the outer boundaries of the first surface.

* * * * *